United States Patent
Ito et al.

(10) Patent No.: US 12,327,665 B2
(45) Date of Patent: Jun. 10, 2025

(54) RESISTOR MATERIAL, RESISTOR ELEMENT AND METHOD OF MANUFACTURING THE RESISTOR ELEMENT

(71) Applicant: RENESAS ELECTRONICS CORPORATION, Tokyo (JP)

(72) Inventors: Nozomi Ito, Tokyo (JP); Yorinobu Kunimune, Tokyo (JP); Kenichiro Abe, Tokyo (JP); Nobuhito Shiraishi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 360 days.

(21) Appl. No.: 17/892,639

(22) Filed: Aug. 22, 2022

(65) Prior Publication Data

US 2023/0116260 A1    Apr. 13, 2023

(30) Foreign Application Priority Data

Oct. 8, 2021 (JP) ................. 2021-165953

(51) Int. Cl.
| | |
|---|---|
| *H01C 7/06* | (2006.01) |
| *H01C 17/232* | (2006.01) |
| *H01C 17/26* | (2006.01) |
| *H10D 1/47* | (2025.01) |

(52) U.S. Cl.
CPC ............ *H01C 7/06* (2013.01); *H01C 17/232* (2013.01); *H01C 17/265* (2013.01); *H10D 1/474* (2025.01)

(58) Field of Classification Search
CPC ...... H01C 7/06; H01C 17/232; H01C 17/265; H01L 28/24
See application file for complete search history.

(56) References Cited

U.S. PATENT DOCUMENTS

| | | | | |
|---|---|---|---|---|
| 5,733,669 A | * | 3/1998 | Veyhl | ............ H01C 7/006 |
| | | | | 428/689 |
| 9,136,216 B2 | | 9/2015 | Nishimura et al. | |
| 2012/0001679 A1 | * | 1/2012 | Privitera | ............ H10N 70/8828 |
| | | | | 29/610.1 |

FOREIGN PATENT DOCUMENTS

| | | | | |
|---|---|---|---|---|
| JP | H8-264304 A | | 10/1996 | |
| JP | 2007-073651 A | | 3/2007 | |
| JP | 2014-165458 A | | 9/2014 | |
| JP | 2014175071 | * | 9/2014 | ......... H01M 10/052 |

OTHER PUBLICATIONS

JP-2014175071 machine translation (Year: 2014).*
Office Action dated Dec. 24, 2024, from corresponding Japanese Patent Application No. 2021-165953, 8 pages.

* cited by examiner

*Primary Examiner* — Kyung S Lee
(74) *Attorney, Agent, or Firm* — Rimon P.C.

(57) ABSTRACT

A resistor material including a plurality of crystalline phases having a positive temperature coefficient of resistance, and an amorphous phase having a negative temperature coefficient of resistance and having a resistivity higher than the crystalline phase, in a mixed state, is provided. Moreover, a resistor element having a resistor film configured by the resistor material described above, and a method of manufacturing a resistor element by forming a film of an amorphous material having a negative temperature coefficient of resistance and subjecting this film to an annealing treatment to obtain the resistor element described above, are provided.

14 Claims, 5 Drawing Sheets

RESISTOR MATERIAL, RESISTOR ELEMENT AND METHOD OF MANUFACTURING THE RESISTOR ELEMENT

CROSS-REFERENCE TO RELATED APPLICATIONS

The disclosure of Japanese Patent Application No. 2021-165953 filed on Oct. 8, 2021 including the specification, drawings and abstract is incorporated herein by reference in its entirety.

BACKGROUND

This invention relates to a resistor material, a resistor element, and a method of manufacturing the resistor element and specifically, a resistor material suitable for a thin-film resistor element of a semiconductor device, a resistor element using the resistor material, and a method of manufacturing the resistor element.

There are disclosed techniques listed below.

[Patent Document 1] Japanese Unexamined Patent Application Publication No. 2014-165458

Conventionally, a semiconductor device having passive parts including thin-film resistors has been known (for example, see Patent Document 1). This semiconductor device makes it possible to eliminate etching damage on the thin-film resistor, preventing an increase in contact resistance with the wiring line.

As a material for forming this thin-film resistor, a material such as SiCr, NiCr, TaN, or TiN can preferably be used, for example.

Also, in recent years, in addition to metal materials, a thin-film resistor adopting an amorphous material has also been examined as a prospective resistor material.

SUMMARY

Meanwhile, in order to form such a resistor element described above, in general, reduction in thickness of the resistor element decreases a sectional area of the resistor element, enabling the resistance of the resistor element to be higher. However, when the thickness of the resistor element is excessively reduced, its mechanical strength may significantly be decreased, or in-plane uniformity may not be able to be maintained. Thus, reduction in thickness of the resistor element has a physical limit.

Alternatively, it has also been known that, as for components contained in the resistor material, by adjusting a composition ratio of the resistor material, a resistivity or a temperature coefficient of resistance (TCR) is varied. Hence, a composition capable of making these properties preferable has also been variously studied.

In view of this, the present inventors aim at providing a novel resistor material having excellent properties of having a high resistivity as well as holding a small temperature coefficient of resistance, while the thickness of the resistor element can be reduced.

According to one embodiment, a resistor material includes a plurality of crystalline phases having a positive temperature coefficient of resistance, and an amorphous phase having a negative temperature coefficient of resistance and having a resistivity higher than the crystalline phase.

According to one embodiment, a resistor element includes a resistor film configured by the resistor material according to the embodiment above.

According to one embodiment, a method of manufacturing a resistor element includes forming a film of an amorphous material having a negative temperature coefficient of resistance so as to form part of a circuit, and subjecting the formed film of the amorphous material to an annealing treatment, and crystallizing part of the amorphous material, thereby forming a resistor film having a plurality of crystalline phases having a positive temperature coefficient of resistance and an amorphous phase having a resistivity higher than the crystalline phase.

According to the resistor material of one embodiment, it is possible to provide a resistor material suitable for a resistor element, the resistor material having a high resistivity and a small temperature coefficient of resistance. In addition, according to the resistor element of one embodiment and the method of manufacturing the resistor element, it is possible to provide a resistor element that is provided as part of a circuit of a semiconductor device and having operational stability and to enhance reliability of a device having the resistor element.

DETAILED DESCRIPTION

Figure 1:
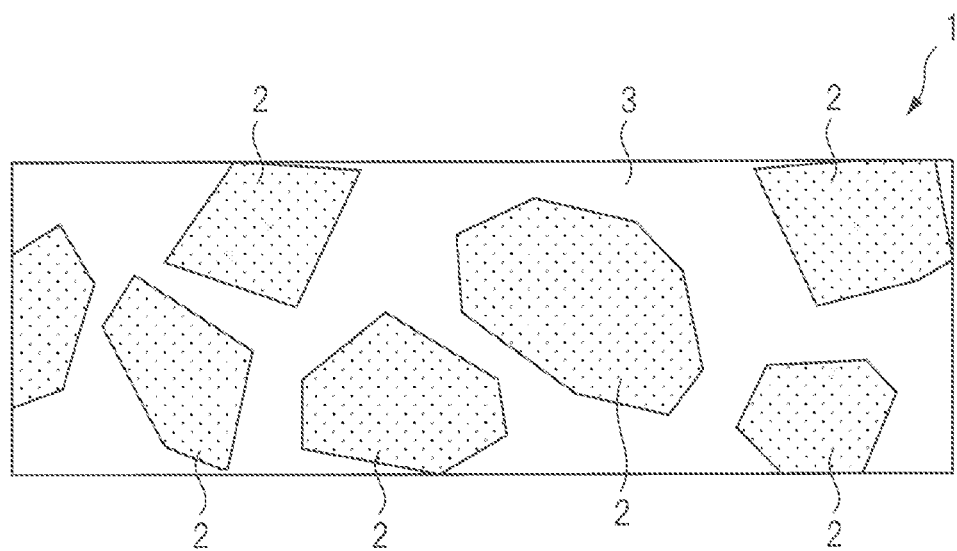
FIG. 1 is a schematic diagram showing a configuration of a resistor material according to an embodiment.

Hereinafter, a resistor material, a resistor element, a method of manufacturing the resistor element, and a method of manufacturing a semiconductor device will be described in detail.

Note that the same components are denoted by the same reference characters throughout the drawings for describing the embodiments, and the repetitive description thereof will be omitted. Also, hatching may be omitted in a cross-sectional view so as to make the drawings easy to see.

Studied Matters

Before describing the present embodiment, matters that have been studied by the present inventors will first be described below.

The present inventors have focused on the amorphous material (also referred to as a Cr—Si—C amorphous material, hereinafter) containing silicon (Si) and chromium (Cr) in addition to carbon (C) as constituent elements and have studied the resistivity and the temperature coefficient of resistance (TCR) of this resistor material.

Figure 5:
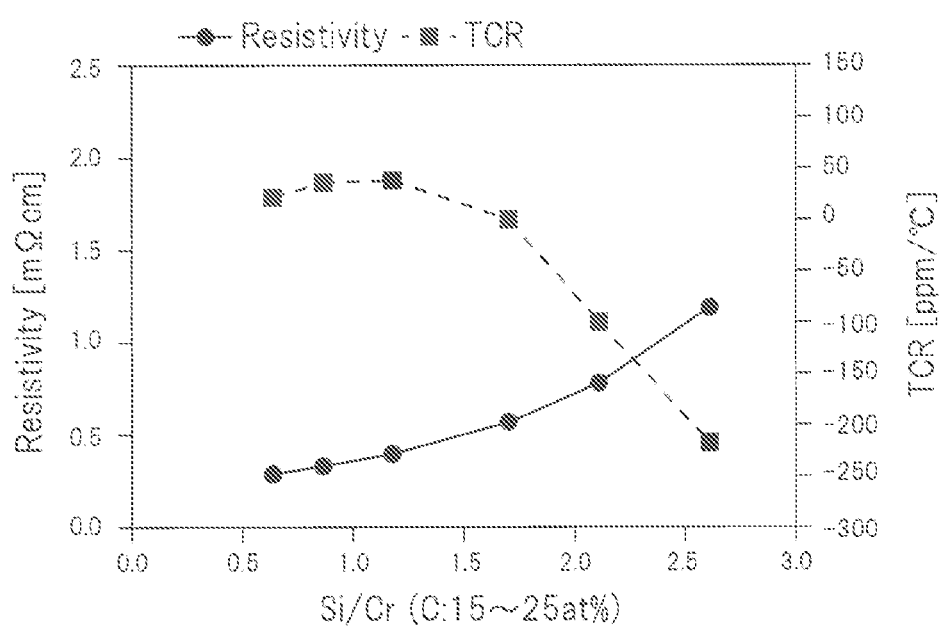
FIG. 5 is a graph indicating a relation among a ratio of silicon content to chromium content, a resistivity, and a temperature coefficient of resistance, in an amorphous material.

Specifically, the present inventors have studied a relation between the resistivity and the temperature coefficient of resistance of the amorphous material, when a ratio of silicon content to chromium content (Si/Cr) in the amorphous material is caused to be varied in terms of the number of atoms, and a result indicated in FIG. 5 was obtained. Incidentally, a carbon content in this amorphous material is 15 at % to 25 at % in terms of the number of atoms. Note that "at %" is also represented by atomic % or atm %.

It became clear that this Cr—Si—C amorphous material improves its resistivity as a result of adjustment of the Si content and the Cr content in the Cr—Si—C amorphous material and that this Cr—Si—C amorphous material is useful as the resistor material. Specifically, when the present inventors studied the ratio of silicon content to chromium content (Si/Cr) in the amorphous material in terms of the number of atoms, it became clear that the resistivity further improves as silicon content is increased and that this Cr—Si—C amorphous material is preferable as the resistor material.

Conversely, it became clear that the temperature coefficient of resistance of the Cr—Si—C amorphous material gradually decreases when Si/Cr exceeds 1.2, the temperature coefficient of resistance of the Cr—Si—C amorphous material further decreases to a great extent when Si/Cr exceeds 1.5, and the temperature coefficient of resistance of the Cr—Si—C amorphous material reaches an unpreferable level as the resistor material when the content ratio (Si/Cr) described above exceeds 2.5 (the absolute value of the temperature coefficient of resistance becomes large).

More specifically, in this Cr—Si—C amorphous material, the resistivity and the temperature coefficient of resistance are in a trade-off relation. Taking into consideration a balance of the resistivity and the temperature coefficient of resistance, when the resistivity is increased, the temperature coefficient of resistance becomes greatly small; thus, further improvement of the resistivity due to a composition ratio is difficult.

To address this problem, the present inventors made intensive studies regarding the novel resistor material achieving, at a high level, both of the properties of having a high resistivity and being capable of holding a small temperature coefficient of resistance, as the resistor material more excellent than the Cr—Si—C amorphous material, and have conceived of the excellent resistor material described below.

Incidentally, the resistivity and the temperature coefficient of resistance here are obtained through a well-known method, and in the present specification, the four-point probe method is adopted to obtain resistivities at 25° C. and calculate temperature coefficients of resistances from resistance values before and after the temperature changes obtained by gradually cooling a sample from 130° C. to –30° C. The resistivities and the temperature coefficients of resistances in the present specification are all calculated by the similar method.

Resistor Material

The resistor material in the present embodiment has a crystalline phase with a positive temperature coefficient of resistance and an amorphous phase with a negative temperature coefficient of resistance and a higher resistivity than the crystalline phase. In the present specification, the temperature coefficient of resistance (TCR) is a value of the temperature coefficient of resistance indicating a rate of change in resistance when the temperature increases by 1° C.

In the present specification, the crystalline phase having a positive temperature coefficient includes crystals with a positive temperature coefficient, and the amorphous phase having a negative temperature coefficient includes amorphous materials with a negative temperature coefficient. Hence, the resistor material in the present embodiment is in a state in which the crystals and the amorphous materials are mixed. In this manner, by mixing the crystalline phase having a positive temperature coefficient and the amorphous phase having a negative temperature coefficient, the absolute value of the temperature coefficient of the resistor material can be made small, achieving the resistor material having little influence by temperature change.

Also, the resistor material in the present embodiment has a plurality of crystalline phases having a positive temperature coefficient, and the amorphous phase is higher in resistivity than the crystalline phases. In other words, the crystalline phase is a material having higher conductivity than the amorphous phase. At this time, the crystalline phase may include a single crystal grain or may be a cluster including two or more crystal grains adjacent to each other. Then, in the present specification, "having a plurality of crystalline phases" means that a plurality of crystalline phases each including a single crystal grain or two or more crystal grains as a cluster are present. It can also be said that the plurality of crystalline phases are spaced apart from each other. At this time, the kind of crystal grain contained in the crystalline phase may be identical to each other or may be different from each other.

Regarding this resistor material, the schematic diagram of its configuration is shown in FIG. 1. As shown in FIG. 1, a resistor material 1 in the present embodiment includes crystalline phases 2 and an amorphous phase 3. As described above, a plurality of crystalline phases 2 are present in the amorphous phase 3 so as to be spaced apart from each other. Note that FIG. 1 illustrates a case in which each of the crystalline phases 2 includes a single grain.

In this manner, it is preferred that the amorphous phase 3 having a negative temperature coefficient is present among the plurality of crystalline phases 2 and that the resistor material has a portion in which the plurality of crystalline phases 2 are not continuous to each other. Since the plurality of crystalline phases 2 are present in a state that the crystalline phases 2 are not continuous to each other, a conductive path formed when applying an electric power to the resistor material 1 transmits electrons, moving between the different phases, from the crystalline phase 2 to the amorphous phase 3, or from the amorphous phase 3 to the crystalline phase 2, for example. In this manner, the conductive path transmits electrons, moving between the phases, and accordingly, it is conceivable that the resistivity of the resistor material in whole becomes large.

At this time, the average crystal grain size of the crystal of the crystalline phase 2 is, for example, preferably 50 nm or less, more preferably 35 nm or less, further preferably 25 nm or less, and most preferably 16 nm or less, depending on a material of the crystal. Also, the average crystal grain size is preferably 2 nm or more, more preferably 6 nm or more, and further preferably 8 nm or more.

Note that, in the present specification, the average crystal grain size of the crystal of the crystalline phase 2 is a value obtained by measuring the crystal grain sizes of several tens of grains (an average value of a major axis and a minor axis of each crystal grain) from an image obtained by a transmission electron microscope (TEM) and calculating an arithmetic mean value of the crystal grain sizes.

The resistor material configured in this manner has a resistivity of preferably 1.0 mΩ·cm or more, more preferably 1.5 mA·cm or more, and further preferably 1.7 mA·cm or more. In a case in which the resistor material has any of the resistivities described above, it is possible to obtain a resistor element having a preferable resistance value also when such resistor material is reduced in its thickness to form the resistor element.

In addition, as this resistor material, an absolute value of the temperature coefficient is preferably 150 ppm/° C. or less, and more preferably 100 ppm/° C. or less. When the temperature coefficient described above is satisfied, it is possible to form a stable resistor element with little change in resistance value attributable to temperature change.

Next, a composition of this resistor material will be described. The resistor material in the present embodiment includes the crystalline phase having a positive temperature coefficient and the amorphous phase having a negative temperature coefficient as described above. This crystalline phase may preferably be crystals obtained by subjecting an amorphous material to the annealing treatment or other processes to crystallize part of the amorphous material.

An example of the resistor material described above includes a material containing, for example, metal, silicon, and carbon as constituent elements, with the crystalline phase including metal-silicon-based crystals and with the amorphous phase including metallic atoms, silicon atoms, and carbon atoms. Here, the metal contained in the resistor material may preferably be a transition metal, more specifically, chromium (Cr), manganese (Mn), iron (Fe), cobalt (Co), or the like, and only one of them may be contained singly, or two or more thereof may be contained in combination.

Among these metals, chromium is most preferable, and accordingly, the resistor material containing chromium (Cr), silicon (Si), and carbon (C) as the constituent elements will be described below as an example.

The resistor material including the preferable constituent elements described above is obtained by, for example, subjecting the amorphous material (Cr—Si—C amorphous material) containing these elements to the annealing treatment (heating treatment) to crystallize part of the amorphous material such that the resistor material has the crystalline phase and the amorphous phase mixed therein. Examples of the metal-silicon-based crystal obtained through this treatment include $Cr_{5-x}Si_{3-z}C_{x+z}$ (where $0 \leq x \leq 3$, $0 \leq z \leq 1$), $CrSi_2$, or the like, and more specifically, $Cr_5Si_3$, $Cr_{4.5}Si_{2.5}C$, $CrSi_2$, or the like.

In addition, as for the constituent elements of this resistor material, it is preferred that the ratio of chromium content to silicon content (Si/Cr) is larger than 2 and the contained amount of carbon is 15 at % to 30 at %, in terms of the number of atoms. Satisfying such contained amount enables the balance between a desired resistivity and the absolute value of the temperature coefficient to be favorable as the resistor material when crystallization by annealing is carried out. Note that Si/Cr is preferably 2.1 or more. Moreover, Si/Cr is preferably 3.5 or less, and more preferably 2.7 or less.

As for the resistor material according to the present embodiment, the resistivity is preferably 1.0 mA·cm or more, more preferably 1.5 mΩ·cm or more, and further preferably 2.0 mΩ·cm or more. In addition, the absolute value of the temperature coefficient of the resistor material is preferably 150 ppm/° C. or less, and more preferably 100 ppm/° C. or less. The resistor material with the resistivity of 1.0 mΩ·cm or more and the absolute value of the temperature coefficient of 150 ppm/° C. or less has such preferable features as high resistance and small temperature coefficient and can be used to form the resistor element more excellent in operational stability, which is preferable.

In addition, adopting the resistivity described above makes it possible to reduce the thickness and the area of the resistor element. Moreover, by making the temperature coefficient small, elimination of a characteristic adjustment circuit or the like can also be achieved. In that case, a chip to be formed can be further reduced in size.

Next, a method of manufacturing the resistor material according to the present embodiment will be described.

First, an amorphous material having a negative temperature coefficient is prepared. It may be sufficient if the amorphous material used here has such a composition as to achieve the features that crystals precipitated through crystallization of the amorphous material have a positive temperature coefficient and are lower in resistivity than the amorphous material.

As for crystallization, it is sufficient if crystals can be precipitated in the amorphous material through the annealing treatment (heating treatment) and if the annealing treatment may be carried out under such a condition that the crystalline phase and the amorphous phase are desirably mixed, by appropriately changing a treatment temperature and a period of time for the treatment, depending on the amorphous material to be used.

The temperature and a period of time for the annealing treatment in this case differ according to the constituent elements of the amorphous material and their compositions (contained amount), and the treatment temperature is preferably 400° C. to 700° C., more preferably 450° C. to 650° C., and the period of time for the annealing treatment is preferably 2 minutes to 30 minutes, and more preferably 5 minutes to 15 minutes, for example. If these treatment conditions cannot be satisfied, crystallization is insufficient, and consequently, the resistivity and the temperature coefficient may not be improved. In contrast, in a case in which crystallization proceeds in excess, the resistivity may become small, and the temperature coefficient may become too large.

In the case of the Cr—Si—C amorphous material described in detail in the above STUDIED MATTERS, for example, the treatment temperature is preferably 500° C. to 540° C., more preferably 510° C. to 530° C., and further preferably 510° C. to 520° C. Adopting such treatment temperatures enables the resistivity to be 1.0 mΩ·cm or more, so that the absolute value of the temperature coefficient can be made small.

Note that the annealing treatment may be carried out under an inert gas atmosphere such as nitrogen or argon, for prevention of oxidation or the like.

Resistor Element

The resistor element according to the present embodiment includes a resistor film configured from the resistor material that has been described above. This resistor element has the resistor film formed from the resistor material having the preferable resistivity and the preferable temperature coefficient as described above, so that the resistor element is higher in operational stability.

This resistor element can be manufactured by a well-known method and can be obtained by providing, for example, a resistor film on part of a circuit in a semiconductor device or the like. A shape or the like of this resistor film is not particularly limited, however, since the resistivity of the resistor film is preferable, it can suitably be used as a thin-film resistor element. A film thickness of the resistor film serving as such a thin-film resistor element is, for example, preferably 50 nm or less, and more preferably, 2.5 nm to 10 nm.

The resistor element according to the present embodiment can be manufactured, in such a manner as to form part of a circuit, for example, by forming a film of the amorphous material having a negative temperature coefficient, then subjecting the obtained film of the amorphous material to the annealing treatment to crystallize part of the amorphous material, and obtaining a resistor film having a plurality of crystalline phases having a positive temperature coefficient and an amorphous phase having a resistivity higher than the crystalline phase.

Film formation of the amorphous material described above may be carried out by a well-known film-forming method and is not limited to a particular kind. As this film-forming method, sputtering such as sputtering using an alloy as a target material, co-sputtering using a plurality of target materials, and reactive sputtering, vacuum vapor deposition, or the like can be used, for example. Since a ratio of constituent elements of the resistor film to be formed is likely to be controlled, film formation by sputtering is preferable.

In addition, as for the annealing treatment, it is sufficient if the resistor film formed above can be heated to a predetermined temperature, and it is not particularly limited to the annealing treatment. It is possible to use a well-known method such as heating with use of heating means such as a heater or heating with laser irradiation or the like.

Treatment condition of the annealing treatment has been described above for the resistor material, and it is preferable that both properties of the resistivity of the resistor element and the absolute value of the temperature coefficient of the resistor element fall in a range of being able to be balanced at a higher level, and for example, such a condition that the resistivity is 1.0 mΩ-cm or more and the absolute value of the temperature coefficient is 150 ppm/° C. or less is preferable.

Semiconductor Device

Moreover, providing the above resistor element as part of a circuit of a semiconductor device makes it possible to obtain a semiconductor device. By way of example, a method of manufacturing this semiconductor device will be described with reference to FIGS. 2A to 2D. FIGS. 2A to 2D depict cross-sectional views of a main part showing a process included in the method of manufacturing the resistor element.

Figure 2A:
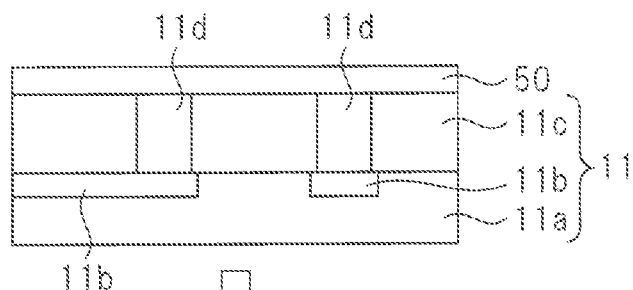
FIGS. 2A to 2D are diagrams each showing a process of manufacturing a resistor element for test that is fabricated in Example.

First, a substrate 11 is prepared (FIG. 2A). The substrate 11 includes a semiconductor substrate 11a, silicide layers 11b, an interlayer insulating film 11c, and contact vias lid. The semiconductor substrate 11a is made of polycrystalline silicon, for example. The silicide layer lib is formed in a front surface of the semiconductor substrate 11a. The interlayer insulating film 11c is formed on the front surface of the semiconductor substrate 11a and is formed of a silicon oxide film, for example. The contact via 11d is provided in the interlayer insulating film 11c. The contact via 11d is made of tungsten, for example, and electrically connects the silicide layer 11b and the resistor film to be described later.

Next, an amorphous film 50 is formed over the substrate 11 (FIG. 2A). This amorphous film 50 is configured by the amorphous material having a negative temperature coefficient as described above, and can be formed by sputtering, vapor deposition, or the like.

Figure 2B:
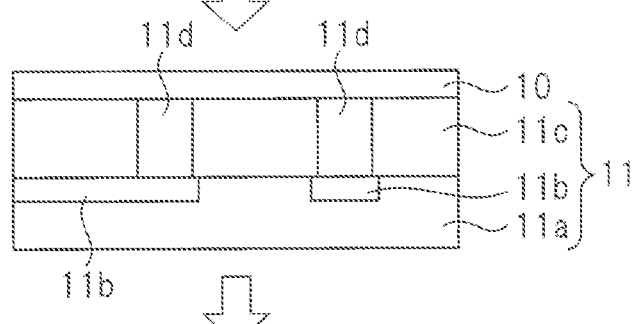

Next, a resistor film 10 is formed. The amorphous film 50 formed over the substrate 11 is subjected to the annealing treatment at a temperature in a range of 400° C. to 700° C., for example, to crystallize part or the whole of the amorphous film 50, and the resistor film 10 is formed (FIG. 2B).

Figure 2C:
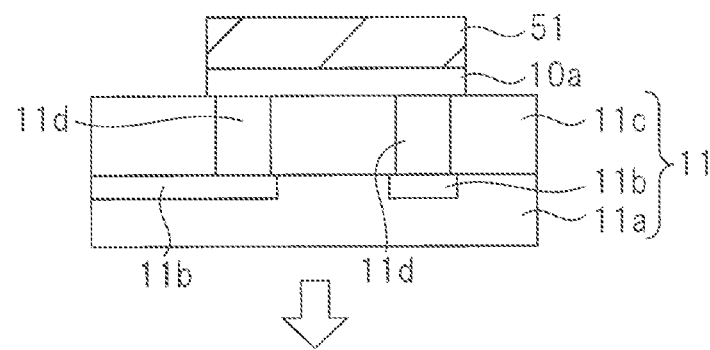

Next, a resistor film 10a for the resistor element is formed. After the annealing treatment, a photoresist film 51 patterned by photolithography is formed over the resistor film 10 and is etched to remove part of the resistor film 10, thereby forming the resistor film 10a for the resistor element (FIG. 2C).

Figure 2D:
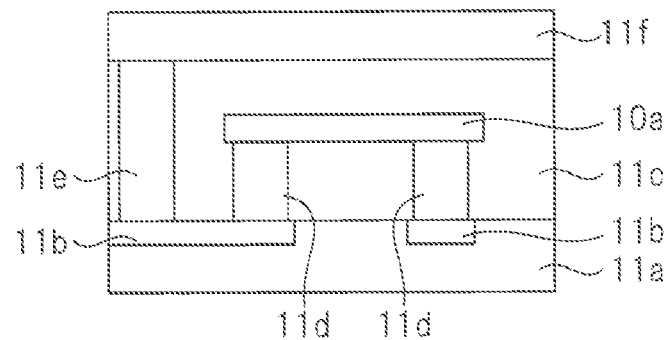

Next, the photoresist film 51 is removed, and an interlayer insulating film is formed on the interlayer insulating film 11c by the chemical vapor deposition (CVD) or the like, to cover the resistor film 10a. Moreover, a via lie made of tungsten is further provided in the interlayer insulating film 11c such that the via 11e is electrically connected with one of the silicide layers 11b connected with the resistor film 10a through the contact via lid. A single-layer metal (1-Metal) 11f made of metal such as aluminum is formed over the interlayer insulating film 11c in such a manner as to electrically connect with this via 11e. Through the above process, the resistor element is obtained (FIG. 2D).

In the present embodiment, as described above, since the resistor element has a high resistivity and a small absolute value of the temperature coefficient, a semiconductor device with higher reliability and preferable operational stability can be obtained by providing the resistor element described above as part of an integrated circuit of the semiconductor device.

EXAMPLE

Method of Manufacturing Resistor Film

An example of a method of manufacturing a resistor film made of the resistor material according to the present example will be described in detail below.

First, a silicon substrate having a silicon dioxide ($SiO_2$) film with a thickness of 600 nm on its front surface is prepared.

Next, an Si—Cr—C amorphous film is formed on the above-described silicon dioxide film of this silicon substrate. First, a target alloy (sputtering target) containing 24 at % chromium (Cr), 52 at % silicon (Si), and 24 at % carbon (C) as constituent elements and with a ratio of the silicon content to the chromium content (Si/Cr) of 2.17, in terms of the number of atoms, is prepared.

With use of this target alloy, by direct current (DC) sputtering (DC power: 0.2 kW to 2 kW, a processing temperature: room temperature to 400° C., a processing pressure: 4 mTorr to 7 mTorr), an Si—Cr—C amorphous film having a thickness of 300 nm is obtained over the silicon substrate.

Next, a resistor film is formed. The Si—Cr—C amorphous film formed on the substrate is subjected to an annealing treatment for ten minutes at a predetermined temperature to crystallize part or the whole of the Si—Cr—C amorphous film, and accordingly, the resistor film is formed.

Measurement of Resistivity and Temperature Coefficient of Resistance

With use of the obtained resistor film for test, the resistivity and the temperature coefficient of resistance of the resistor film were obtained through the same test method as that in FIG. 5. Note that the resistivity and the temperature coefficient of resistance of the resistor element having the Si—Cr—C amorphous film that has been obtained in the similar manner as the above, except that the annealing treatment has not been carried out, were obtained as well. A relation between the annealing temperature, the resistivity, and the temperature coefficient of resistance that have been obtained is summarized in TABLE 1 and FIG. 3.

Note that the annealing treatment (annealing temperature) of the amorphous film was carried out at 12 ways such as 450° C., 500° C., 510° C., 520° C., 530° C., 540° C., 550° C., 600° C., 700° C., 800° C., 900° C., and 1000° C., for ten minutes each.

TABLE 1

| ANNEALING TREATMENT | RESISTIVITY [mΩ·cm] | TEMPERATURE COEFFICIENT (TCR) [ppm/° C.] |
|---|---|---|
| UNTREATED | 0.8 | −508 |
| 450° C., 10 MINUTES | 1.1 | −259 |
| 500° C., 10 MINUTES | 1.3 | −163 |
| 510° C., 10 MINUTES | 1.5 | −30 |
| 520° C., 10 MINUTES | 1.8 | 112 |
| 530° C., 10 MINUTES | 2.0 | 217 |
| 540° C., 10 MINUTES | 2.0 | 294 |
| 550° C., 10 MINUTES | 1.3 | 543 |
| 600° C., 10 MINUTES | 0.8 | 722 |
| 700° C., 10 MINUTES | 0.9 | 960 |
| 800° C., 10 MINUTES | 0.8 | 1155 |
| 900° C., 10 MINUTES | 0.7 | 1334 |
| 1000° C., 10 MINUTES | 0.6 | 1440 |

Figure 3:
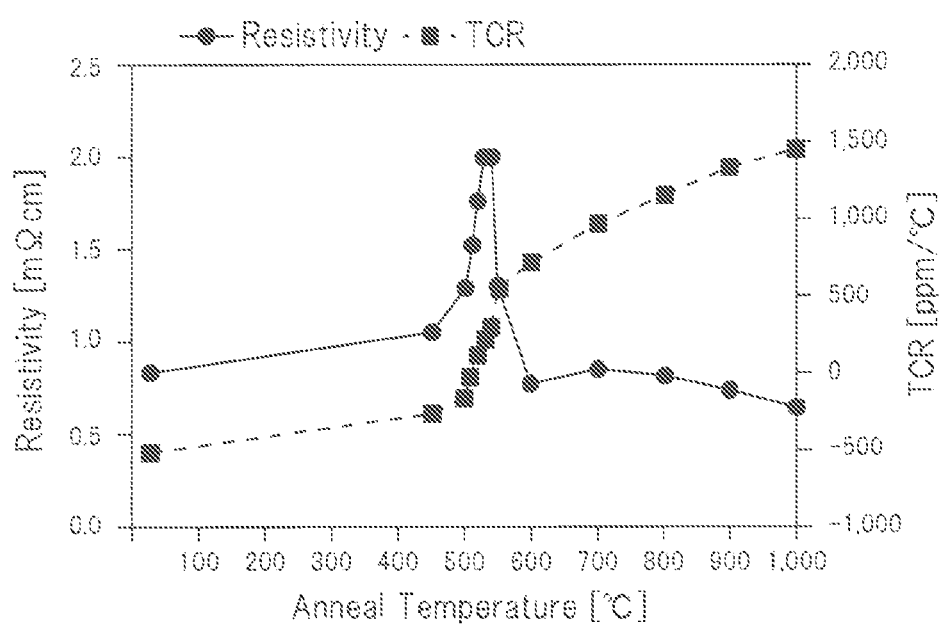
FIG. 3 is a graph indicating a relation among an annealing temperature, a resistivity, and a temperature coefficient of resistance of the resistor material obtained in Example.

According to TABLE 1 and FIG. 3, a tendency of variation in resistivity and temperature coefficient of resistance can be understood. Specifically, in the case of using the amorphous material as a raw material (the annealing treatment is not undergone), the resistivity is 0.85 mΩ·cm and the temperature coefficient of resistance is −500 ppm/° C. or less, and the absolute value of the temperature coefficient of resistance is significantly large. Also, the resistor films obtained by carrying out the annealing treatment at 600° C. to 1000° C. represent 0.6 mΩ·cm to 0.9 mΩ·cm in resistivity and 700 ppm/° C. to 1500 ppm/° C. in temperature coefficient of resistance, and the results indicate that the absolute values of the temperature coefficient of resistance for these resistor films are significantly large. These materials are not suitable as the resistor material for the resistor element to be used in the semiconductor device, in terms of temperature coefficient.

In contrast, the resistor films obtained by carrying out the annealing treatment at 500° C. to 540° C. for ten minutes represent 1.3 mΩ·cm or more in resistivity, which is high, and the absolute value of the temperature coefficient of resistance of each of the resistor films is 300 ppm/° C. or less, which is preferable. Moreover, the resistor films obtained by carrying out the annealing treatment at 520° C. to 530° C. for ten minutes represent that 1.8 n·cm or more in resistivity, which is higher, and the absolute value of the temperature coefficient of resistance of each of the resistor films is 250 ppm/° C. or less, which is more preferable.

Further, among these resistor films, the resistor film that has not undergone the annealing treatment, the resistor films having undergone the annealing treatment at 450° C., 540° C., 600° C., and 1000° C. were subjected to the X-ray diffraction method (XRD) (measurement condition: Cu(Kα) target, Out-of-Plane measurement, 2θ measurement range: 30 degrees to 50 degrees) to obtain an X-ray diffraction pattern, and a state of presence of the crystals was checked. The results are indicated in FIG. 4.

Figure 4:
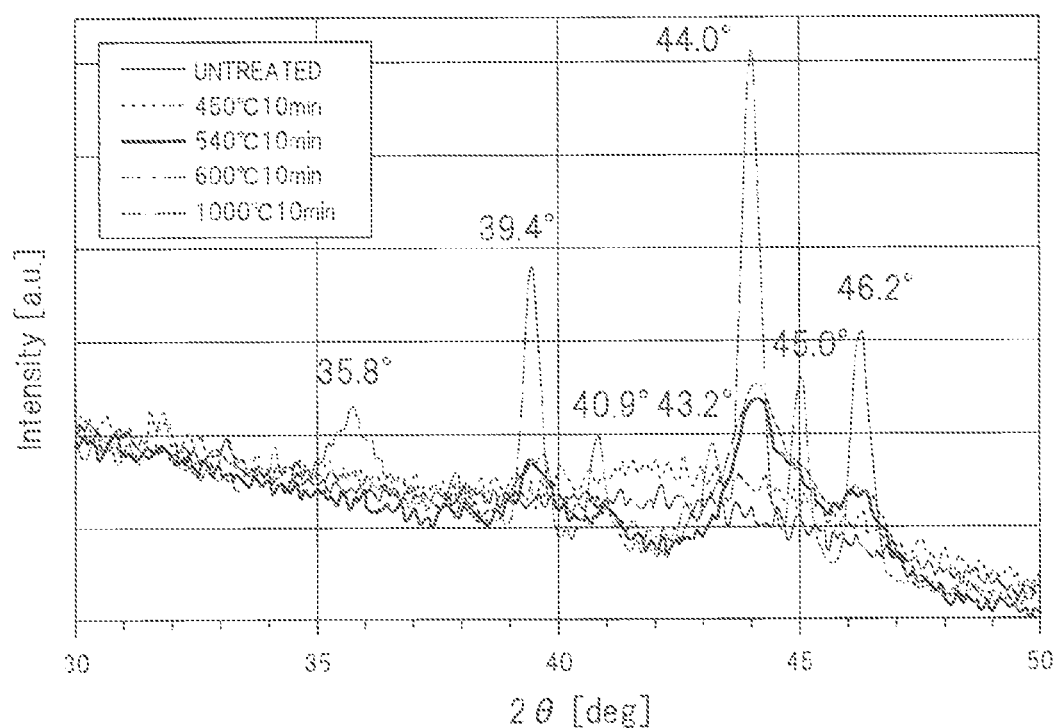
FIG. 4 is a diagram showing X-ray diffraction patterns in the resistor material obtained in Example.

In the X-ray diffraction spectrum indicated in FIG. 4, a peak of 35.8° represents SiC, a peak of 39.4° represents $Cr_5Si_3$ and $CCr_{4.5}Si_{2.5}$, a peak of 40.9° represents $Cr_5Si_3$ and $CCr_{4.5}Si_{2.5}$, a peak of 43.2° represents $CrSi_2$, a peak of 44.0° represents $Cr_5Si_3$ and $CCr_{4.5}Si_{2.5}$, a peak of 45.0° represents $Cr_5Si_3$ and $CCr_{4.5}Si_{2.5}$, and a peak of 46.2° represents $CCr_{4.5}Si_{2.5}$.

From the results of the X-ray diffraction, the kinds of crystal generated according to variation in annealing temperature are as indicated in the following TABLE 2.

TABLE 2

| ANNEALING TREATMENT | PEAK OF XRD (KINDS OF CRYSTAL) |
|---|---|
| UNTREATED | — |
| 450° C., 10 MINUTES | — |
| 540° C., 10 MINUTES | $Cr_5Si_3$, $Cr_{4.5}Si_{2.5}C$, $CrSi_2$ |
| 600° C., 10 MINUTES | $Cr_5Si_3$, $Cr_{4.5}Si_{2.5}C$, $CrSi_2$ |
| 1000° C., 10 MINUTES | $Cr_5Si_3$, $Cr_{4.5}Si_{2.5}C$, $CrSi_2$, SiC |

In addition, for the resistor films of which the X-ray diffraction patterns have been obtained, cross-sectional images were obtained by the TEM, and states of crystals in the resistor films were checked. It was checked that the resistor film having undergone the annealing treatment at 540° C. for ten minutes has small crystals generated therein and the crystalline phase and the amorphous phase are mixed. At this time, the average grain size of the crystals generated was approximately 13 nm as a result of calculation of each grain size of the crystals and the periodicity of each crystal in the TEM image.

In addition, similarly, the resistor film having undergone the annealing treatment at 600° C. for ten minutes has microcrystals and crystals of a middle size mixed therein, and it is conceivable that, taking the value of the above-described resistivity into consideration, the crystals are continuous with each other and the conductive path of the crystals is thereby formed, so that the resistivity becomes small. Moreover, the resistor film having undergone the annealing treatment at 1000° C. for ten minutes has large crystals in great number, and it is conceivable that the resistor film is completely crystallized.

In the foregoing, the invention made by the inventors of the present invention has been concretely described based on the embodiments. However, it is needless to say that the present invention is not limited to the foregoing embodiments and various modifications and alterations can be made within the scope of the present invention.

SUPPLEMENTARY NOTE

Also, the present application includes the following aspect.

A method of manufacturing a semiconductor device includes: a step of preparing a substrate including a semiconductor substrate, a silicide layer formed in a front surface of the semiconductor substrate, an interlayer insulating film formed over the front surface of the semiconductor substrate, and a contact via provided in the interlayer insulating film; a step of forming an amorphous film configured by an amorphous material including silicon, chromium, and carbon by sputtering, over the substrate; and a step of subjecting the amorphous film to an annealing treatment to crystallize part of the amorphous film, thereby forming a resistor film, in which a temperature of the annealing treatment in the step of forming the resistor film is in a range of 400° C. to 700° C.

In the foregoing, the disclosure made by the discloser has been specifically described based on the embodiment and the examples, but it goes without saying that this disclosure is not limited to the embodiment and the examples described above and can be variously modified within the range not departing from the gist thereof.

What is claimed is:

1. A resistor material comprising:
   a plurality of crystalline phases having a positive temperature coefficient of resistance; and an amorphous phase having a negative temperature coefficient of resistance and having a resistivity higher than each of the plurality of the crystalline phases,
wherein the resistor material consists of Cr—Si—C as constituent elements.

2. The resistor material according to claim 1,
wherein the amorphous phase is present among the plurality of crystalline phases and a portion in which the plurality of crystalline phases are not continuous to each other is provided.

3. The resistor material according to claim 1,
wherein a resistivity of the resistor material is 1.0 mΩ·cm or more and an absolute value of the temperature coefficient of resistance of the resistor material is 150 ppm/° C. or less.

4. The resistor material according to claim 1,
wherein each of the plurality of crystalline phases includes a chromium-silicon-based crystal, and the amorphous phase includes a chromium atom, a silicon atom, and a carbon atom.

5. The resistor material according to claim 1, wherein, in the constituent elements, a ratio of silicon content to chromium content (Si/Cr) is larger than 2 and carbon content is 15 at % to 30 at %, in terms of the number of atoms.

6. The resistor material according to claim 5, wherein a resistivity of the resistor material is 1.5 mΩ·cm or more.

7. The resistor material according to claim 1, wherein an average grain size of crystals contained in the plurality of crystalline phases is 50 nm or less.

8. The resistor material according to claim 7, wherein the average grain size of the crystals is 5 nm to 35 nm.

9. A resistor element comprising:
a resistor film configured by the resistor material according to claim 1.

10. A method of manufacturing a resistor element, comprising:
forming a film of an amorphous material having a negative temperature coefficient of resistance so as to form part of a circuit; and
subjecting the formed film of the amorphous material to an annealing treatment, and crystallizing part of the amorphous material, thereby forming a resistor film having a plurality of crystalline phases having a positive temperature coefficient of resistance and an amorphous phase having a resistivity higher than the crystalline phase,
wherein the amorphous material consists of Cr—Si—C as constituent elements,
wherein a temperature of the annealing treatment is 500° C. to 540° C., and
wherein a period of time for the annealing treatment is 2 minutes to 30 minutes.

11. The method according to claim 10,
wherein, in the constituent elements, a ratio of silicon content to chromium content (Si/Cr) is larger than 2 and carbon content is 15 at % to 30 at %, in terms of the number of atoms.

12. The method according to claim 11,
wherein the annealing treatment is carried out such that the resistor film has a portion in which the plurality of crystalline phases are not continuous to each other due to presence of the amorphous phase among the plurality of crystalline phases.

13. The method according to claim 12,
wherein each of the plurality of crystalline phases includes a chromium-silicon-based crystal, and the amorphous phase includes a chromium atom, a silicon atom, and a carbon atom.

14. The method according to claim 11,
wherein an average grain size of crystals constituting the plurality of crystalline phases is 35 nm or less.

* * * * *